United States Patent
Asano

(10) Patent No.: US 7,109,709 B2
(45) Date of Patent: Sep. 19, 2006

(54) MAGNETIC RESONANCE IMAGING APPARATUS AND CENTRAL FREQUENCY ESTIMATING METHOD

(75) Inventor: Kenji Asano, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 65 days.

(21) Appl. No.: 10/945,686

(22) Filed: Sep. 21, 2004

(65) Prior Publication Data

US 2005/0068029 A1    Mar. 31, 2005

(30) Foreign Application Priority Data

Sep. 25, 2003    (JP)    ............................. 2003-333999

(51) Int. Cl.
  *G01V 3/00*    (2006.01)
(52) U.S. Cl. ..................................... 324/307
(58) Field of Classification Search ............... None
  See application file for complete search history.

(56) References Cited

U.S. PATENT DOCUMENTS

| | | | |
|---|---|---|---|
| 4,740,748 A | | 4/1988 | Rzedzian |
| 4,789,833 A | * | 12/1988 | Nishimura ............... 324/320 |
| 4,818,942 A | | 4/1989 | Rzedzian |
| 5,121,059 A | | 6/1992 | Wieland |
| 5,557,202 A | | 9/1996 | Miyazaki et al. |
| 5,560,360 A | | 10/1996 | Filler et al. |
| 5,657,758 A | | 8/1997 | Posse et al. |
| 5,677,626 A | | 10/1997 | Miyazaki et al. |
| 5,709,208 A | | 1/1998 | Posse et al. |
| 5,729,138 A | | 3/1998 | Purdy et al. |
| 6,054,853 A | * | 4/2000 | Miyamoto et al. ........... 324/309 |
| 6,900,632 B1 | * | 5/2005 | Uetake ...................... 324/307 |
| 6,980,845 B1 | * | 12/2005 | Alsop ........................ 600/410 |

FOREIGN PATENT DOCUMENTS

| | | |
|---|---|---|
| EP | 0913701 A2 | 5/1999 |
| JP | 07-327960 A | 12/1995 |

OTHER PUBLICATIONS

John P. Mugler III and James R. Brookeman, Three-Dimensional Magnetization-Prepared Rapid Gradient-Echo Imaging (3D MP Rage), Magnetic Resonance in Medicine 15, 152-157 (1990).
European Patent Office Search Report; 155221/10243; 04255753. 8-1234-; GE Medical Systems Global Technology Company LLC; 3 pgs.
Glen Morrell et al.; Dynamic Shimming for Multi-Slice Magnetic Resonance Imaging; BNS DOCID:XP-699722A-1; MRM 38:477-483 (1997).

* cited by examiner

*Primary Examiner*—Diego Gutierrez
*Assistant Examiner*—Dixomara Vargas
(74) *Attorney, Agent, or Firm*—Carl B. Horton, Esq.; Armstrong Teasdale LLP

(57) ABSTRACT

A method for estimating a central frequency includes defining a slice group containing a plurality of slices parallel to one another within an arbitrary imaged region in a subject, measuring a central frequency of at least one slice contained in the slice group, and estimating central frequencies of the other slices based on the measured central frequency of the at least one slice.

20 Claims, 5 Drawing Sheets

MAGNETIC RESONANCE IMAGING APPARATUS AND CENTRAL FREQUENCY ESTIMATING METHOD

CROSS REFERENCE TO RELATED APPLICATIONS

This application claims the benefit of Japanese Application No. 2003-333999 filed Sep. 25, 2003.

BACKGROUND OF THE INVENTION

The present invention relates to a central frequency estimating method for use in magnetic resonance imaging, for estimating a magnetic resonance frequency, i.e., central frequency, in certain tissue, and a magnetic resonance imaging apparatus for producing a magnetic resonance image based on the central frequency acquired by the central frequency estimating method.

Magnetic resonance imaging (MRI) is a technique of applying a gradient magnetic field and an RF (radio frequency) wave to a subject in a static magnetic field, and producing an image based on magnetic resonance signals emitted as an echo from protons in a region to be examined.

There is known a magnetic resonance imaging technique such as a CHESS (chemical selective suppression) technique, which collects magnetic resonance signals having a specific frequency suppressed, and produces an image based on the magnetic resonance signals having the specific frequency suppressed.

For example, the CHESS technique applies an RF wave having the same frequency as the resonance frequency of fat protons to a region to be examined in a subject to excite only the fat protons, and then applies a gradient magnetic field for saturating the fat protons to collect magnetic resonance signals having the resonance frequency of the fat protons suppressed (See Non-Patent Document 1, for example).

As can be seen from this, it is important to accurately know the resonance frequency of protons of tissue to be suppressed in the CHESS technique. The resonance frequency of protons of the tissue of interest is sometimes referred to as the central frequency.

In magnetic resonance imaging such as that according to the CHESS technique, it is desirable to accurately obtain the central frequency.

The resonance frequency of protons is determined by the magnitude of a static magnetic field and the gyromagnetic ratio that depends upon the type of protons in tissue. Thus, as the magnitude of a static magnetic field varies, so does the central frequency. An open magnetic resonance imaging system having a static magnetic field with magnetic field intensity around 0.2–0.7 Teslas, which is sometimes referred to as an open mid-to-low magnetic field system, for example, has a relatively inhomogeneous static magnetic field, and tends to have some positional variation in the magnitude of the static magnetic field.

Therefore, when the CHESS technique is employed in the mid-to-low magnetic field system, for example, a central frequency is desirably determined for each cross-sectional slice (referred to simply as a slice) of certain thickness that represents a region to be imaged in the subject.

The central frequency for each slice can be obtained by measurement in a process called a prescan, which is conducted before an actual scan for acquiring a magnetic resonance image of the subject.

[Non-Patent Document 1] Mugler J. P., $3^{rd}$ and Brookeman Jr., "Three-dimensional Magnetization-Prepared Rapid Gradient-Echo Imaging," *Magnetic Resonance in Medicine,* 15(1), pp. 152–157 (July 1990).

When the number of slices corresponding to an imaged region is large and the central frequency is obtained for every slice, the prescan requires a long time in proportion.

If the time required for the prescan increases, the subject suffers a decline in comfort, making motion of the subject more likely, so that problems may arise, such as that reliability of data for the central frequency obtained is reduced.

SUMMARY OF THE INVENTION

It is therefore an object of the present invention to provide a central frequency estimating method capable of reducing time taken to obtain a central frequency for each slice when a plurality of slices corresponding to an imaged region exist, as compared with the time taken to measure the central frequency for every slice, and of ensuring accuracy of the obtained central frequency at a certain level.

Moreover, it is another object of the present invention to provide a magnetic resonance imaging apparatus that employs the central frequency estimating method, capable of reducing time taken to obtain a central frequency for each slice when a plurality of slices corresponding to an imaged region exist, as compared with the time taken to measure the central frequency for every slice, and of ensuring accuracy of the obtained central frequency at a certain level.

A magnetic resonance imaging apparatus in accordance with the present invention is for selecting a slice of certain thickness in a subject, and generating image data of said slice based on magnetic resonance signals of desired central frequency obtained from said slice, and comprises: slice group defining means for defining a slice group containing a plurality of said slices parallel to one another within an arbitrary imaged region in said subject; central frequency measuring means for measuring a central frequency of any one of said slices contained in said slice group; and central frequency estimating means for estimating central frequencies of said slices other than that whose central frequency is measured, based on said central frequency obtained by the measurement by said central frequency measuring means.

A central frequency estimating method in accordance with the present invention is for use in a magnetic resonance imaging apparatus for selecting a slice of certain thickness in a subject, and generating image data of said slice based on magnetic resonance signals of desired central frequency obtained from said slice, and comprises: a slice group defining step of defining a slice group containing a plurality of said slices parallel to one another within an arbitrary imaged region in said subject; a central frequency measuring step of measuring a central frequency of any one of said slices contained in said slice group; and a central frequency estimating step of estimating central frequencies of said slices other than that whose central frequency is measured, based on said central frequency obtained at said central frequency measuring step.

According to the present invention, the slice group defining means defines a slice group containing a plurality of slices parallel to one another within an arbitrary imaged region in a subject. The central frequency measuring means measures a central frequency of any one of the slices contained in the slice group defined by the slice group defining means. The central frequency estimating means estimates central frequencies of slices other than that whose central frequency is measured in the slice group using the central frequency obtained by the central frequency measuring means. Thus, the central frequencies of all slices in the slice group can be obtained, including the actually measured central frequency and estimated ones.

The central frequency thus obtained for each slice is used to detect magnetic resonance signals from that slice, and image data for each slice is generated based on the magnetic resonance signals.

According to the present invention, it is possible to reduce time taken to obtain a central frequency for each slice when a plurality of slices corresponding to an imaged region exist, as compared with the time taken to measure the central frequency for every slice, and to ensure accuracy of the obtained central frequency at a certain level.

The present invention can be employed in the field of magnetic resonance signal reception. The present invention is not limited to use in magnetic resonance imaging in medical applications but may be employed in general applications in which information on the central frequency is required in magnetic resonance signal reception.

Further objects and advantages of the present invention will be apparent from the following description of the preferred embodiments of the invention as illustrated in the accompanying drawings.

DETAILED DESCRIPTION OF THE INVENTION

Several embodiment of the present invention will now be described with reference to the accompanying drawings.

<<First Embodiment>>

Figure 1:
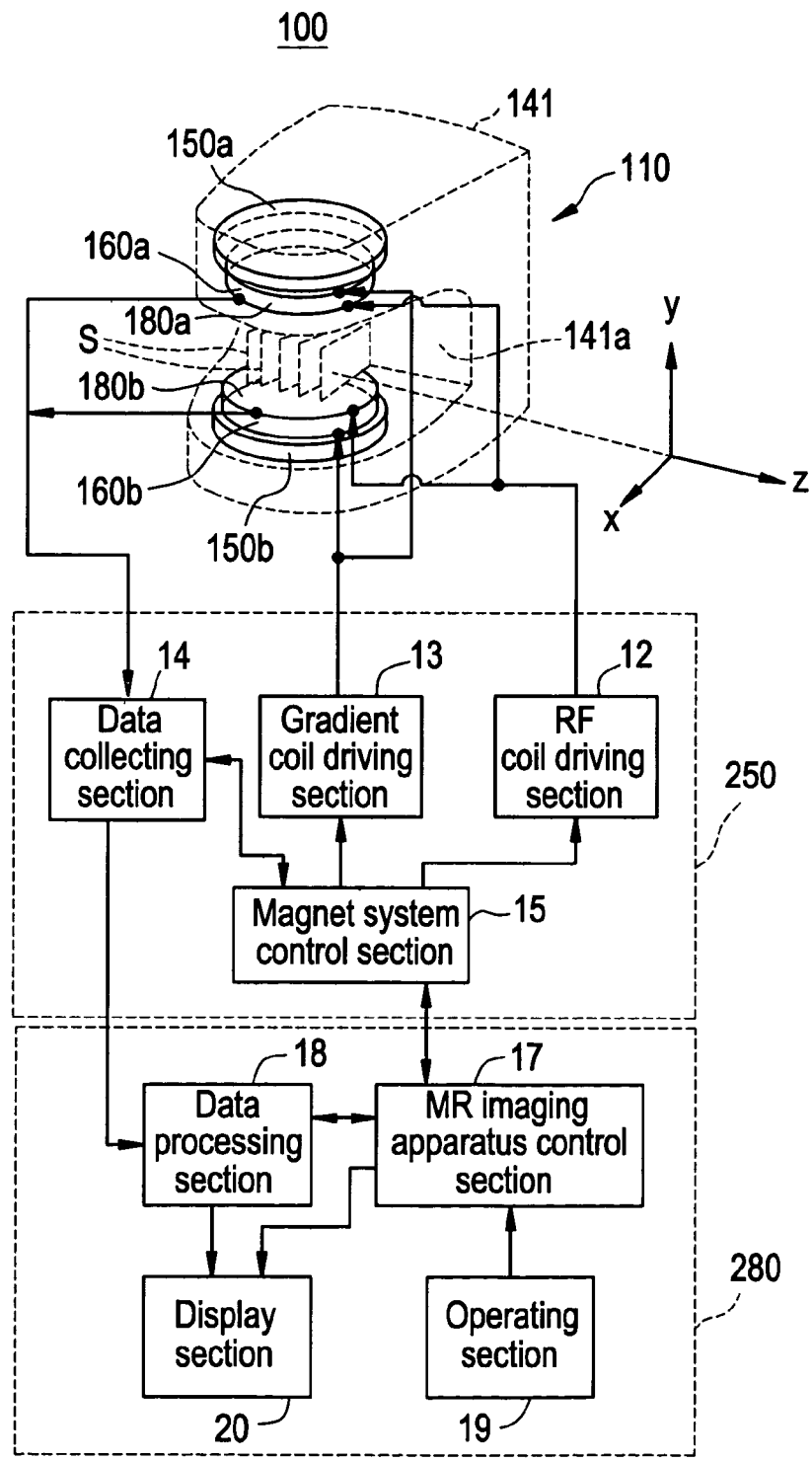
FIG. 1 is a schematic block diagram generally showing the configuration of an MR imaging apparatus in accordance with a first embodiment of the present invention.

FIG. 1 is a schematic block diagram that generally shows the configuration of an MR (magnetic resonance) imaging apparatus in accordance with the first embodiment of the present invention.

An MR imaging apparatus 100 shown in FIG. 1 comprises a main body section 110 and a console section 280. In FIG. 1, the main body section 110 is illustrated in a schematic perspective phantom view of its main portion.

The main body section 110 comprises a magnet system and a driving section 250.

The magnet system includes a pair of static magnetic field generating magnet sections 150a and 150b, gradient coil sections 160a and 160b, and RF (radio frequency) coil sections 180a and 180b, each member being disposed to face its counterpart in a housing 141 of the main body section 110.

These sections are disposed with each member facing its counterpart and are arranged in order of, for example, the RF coil sections 180a and 180b, gradient coil sections 160a and 160b, and static magnetic field generating magnet sections 150a and 150b from the inside. Between the innermost RF coil sections 180a and 180b, a bore 141a is formed, in which a subject (not shown) is positioned.

Since the MR imaging apparatus 100 as shown in FIG. 1 has the housing 141 constructed in a shape such that the bore 141a is largely open, it is called an open MR imaging apparatus.

The driving section 250 comprises an RF coil driving section 12, a gradient coil driving section 13, a data collecting section 14, and a magnet system control section 15. Although these sections are illustrated as being apart from the main body section 110 to clearly show their connection relationship in FIG. 1, they are actually provided inside the housing 141 of the main body section 110, for example.

The magnet system control section 15 is connected to the RF coil driving section 12, gradient coil driving section 13, and data collecting section 14.

The RF coil driving section 12 and data collecting section 14 are connected to the RF coil sections 180a and 180b. The gradient coil driving section 13 is connected to the gradient coil sections 160a and 160b.

As will be discussed later in detail, one embodiment of the slice group defining means in the present invention is comprised of the gradient coil sections 160a and 160b, gradient coil driving section 13 and magnet system control section 15. One embodiment of the central frequency measuring means in the present invention is comprised of the RF coil sections 180a and 180b, RF coil driving section 12, data collecting section 14 and magnet system control section 15. Moreover, one embodiment of the central frequency estimating means is implemented by the magnet system control section 15.

The static magnetic field generating magnet sections 150a and 150b are made using a permanent magnet, for example. The static magnetic field generating magnet sections 150a and 150b disposed to face each other generate a static magnetic field in the bore 141a.

The direction of the static magnetic field generated by the static magnetic field generating magnet sections 150a and 150b is defined as a y-direction, for example. As shown in FIG. 1, since the static magnetic field generating magnet sections 150a and 150b are vertically disposed facing each other in the present embodiment, the vertical direction represents the y-direction. The static magnetic field in the vertical direction is sometimes referred to as a vertical magnetic field.

Moreover, the two directions orthogonal to the y-direction are defined as x- and z-directions, as shown in FIG. 1. Although not shown, in many cases, the subject is positioned in the bore 141a so that the subject's body axis direction from head to toe coincides with the z-direction.

In current open MR imaging apparatuses, the magnetic field intensity of the static magnetic field is about 0.2–0.7 Teslas (T). A magnet system of about 0.2–0.7 Teslas is generally referred to as a mid-to-low magnetic field system.

The gradient coil sections 160a and 160b have three pairs of gradient coils for assigning three-dimensional position information to magnetic resonance signals detected by the RF coil sections 180a and 180b. The gradient coil sections 160a and 160b use these gradient coils to generate gradient magnetic fields for imparting gradients to the intensity of the static magnetic field generated by the static magnetic field generating magnet sections 150a and 150b.

The RF coil sections 180a and 180b include transmission and reception RF coils. The transmission RF coil applies a magnetic field in an RF band to the region to be examined in the subject lying in the static magnetic field for inclining an axis of spin rotation of protons in the region to be examined. The magnetic field in an RF band will be referred to simply as an RF wave hereinbelow.

Upon termination of the application of the RF wave by the transmission RF coil, magnetic resonance signals having the same resonance frequency as the applied RF wave's frequency band are re-emitted from the region to be examined owing to spins in the region to be examined. The reception RF coil detects the magnetic resonance signals from the region to be examined.

The transmission and reception RF coils may be the same coil, or may be separate dedicated coils with, for example, the RF coil in the RF coil section 180a used as a transmission coil and the RF coil in the RF coil section 180b as a reception RF coil.

Moreover, besides the RF coil sections 180a and 180b that are contained in the housing 141, a dedicated RF coil adapted for a region to be examined in the subject, such as the head, abdomen or shoulder, may be employed as the transmission/reception RF coil.

The frequency range of the RF wave is 2.13 MHz–85 MHz, for example.

The gradient coil driving section 13 transmits a gradient magnetic field excitation signal for generating gradient magnetic fields for imparting tri-directional gradients in x, y and z to the intensity of the static magnetic field to the aforementioned three gradient coils.

In response to the gradient magnetic field excitation signal from the gradient coil driving section 13, the gradient coil sections 160a and 160b are driven to generate three-dimensional gradients in the intensity of the static magnetic field, whereby a region to be imaged in the subject is defined. The imaged region is defined by a unitary cross-sectional slice having a certain thickness.

The RF coil driving section 12 supplies an RF wave excitation signal to the RF coil sections 180a and 180b to apply an RF wave to the subject in the bore 141a, thereby inclining the axis of spin rotation of protons in the region to be examined and exciting the protons.

The data collecting section 14 takes in magnetic resonance signals detected by the RF coil sections 180a and 180b, and collects them as original data for magnetic resonance image production.

After the data collecting section 14 has collected all of data for producing an image, for example, it sends the collected data to a data processing section 18 in a console section 280, which will be discussed later.

The data collecting section 14 also sends part of the data of the taken-in magnetic resonance signals to a magnet system control section 15.

The magnet system control section 15 is implemented by, for example, hardware for calculation, such as CPU (central processing unit), and software for driving the hardware, such as programs.

In response to an instruction signal from the console section 280, the magnet system control section 15 controls the RF coil driving section 12, gradient coil driving section 13 and data collecting section 14 so that desired magnetic resonance signal data may be obtained.

Detailed description on the control by the magnet system control section 15 will be made later.

The console section 280 is provided for several kinds of operations for acquiring a magnetic resonance image of the subject by the main body section 110, including inputting of command parameters to the magnet system control section 15 and inputting of an imaging initialization command.

As shown in FIG. 1, the console section 280 comprises an MR imaging apparatus control section 17, a data processing section 18, an operating section 19, and a display section 20.

One embodiment of the control means in the present invention corresponds to the MR apparatus control section 17.

The MR imaging apparatus control section 17 is connected to the data processing section 18 and display section 20. The data processing section 18 is connected to the display section 20.

Moreover, the data processing section 18 is connected with the data collecting section 14, and the MR apparatus control section 17 is connected with the operating section 19.

The operating section 19 is implemented by an input device, such as keyboard and mouse. A signal of a command from an operator operating the console section 280 is input to the MR apparatus control section 17 via the operating section 19.

The MR imaging apparatus control section 17 is implemented by, for example, hardware for calculation, such as CPU, and software for driving the hardware, such as programs.

The programs are stored in a storage section (not shown) implemented by a RAM (random access memory) and a hard disk drive, for example.

In response to an instruction signal from the operator input via the operating section 19, the MR imaging apparatus control section 17 integrally controls the RF coil driving section 12, gradient coil driving section 13 and data collecting section 14 via the magnet system control section 15 in conformance with the command of the instruction signal.

The instruction signals input to the MR apparatus control section 17 include several conditions such as an imaged position and an imaging technique, and the MR apparatus control section 17 conducts control so that these conditions are fulfilled. If limitations such as hardware limitation by the main body section 110 are encountered, the MR apparatus control section 17 displays on a display section 20 a message indicating that the input command cannot be executed.

The data processing section 18 executes processing for producing a magnetic resonance image by applying pre-specified processing including calculation and image processing on the magnetic resonance signal data sent from the data collecting section 14, based on a command from the operator input via the operating section 19 and MR apparatus control section 17. The image produced by the data processing section 18 can be stored in the storage section (not shown).

The image produced by the data processing section 18 is appropriately displayed on the display section 20 in response to a request from the operator.

The display section 20 is implemented by a monitor such as a liquid crystal display panel or a CRT (cathode-ray tube).

The display section 20 also displays an operation image for operating the MR imaging apparatus 100.

The MR imaging apparatus 100 having the aforementioned configuration can be used to obtain a magnetic resonance image of the subject. Now properties of magnetic resonance signals detected by the RF coil sections 180a and 180b will be described.

Figure 7:
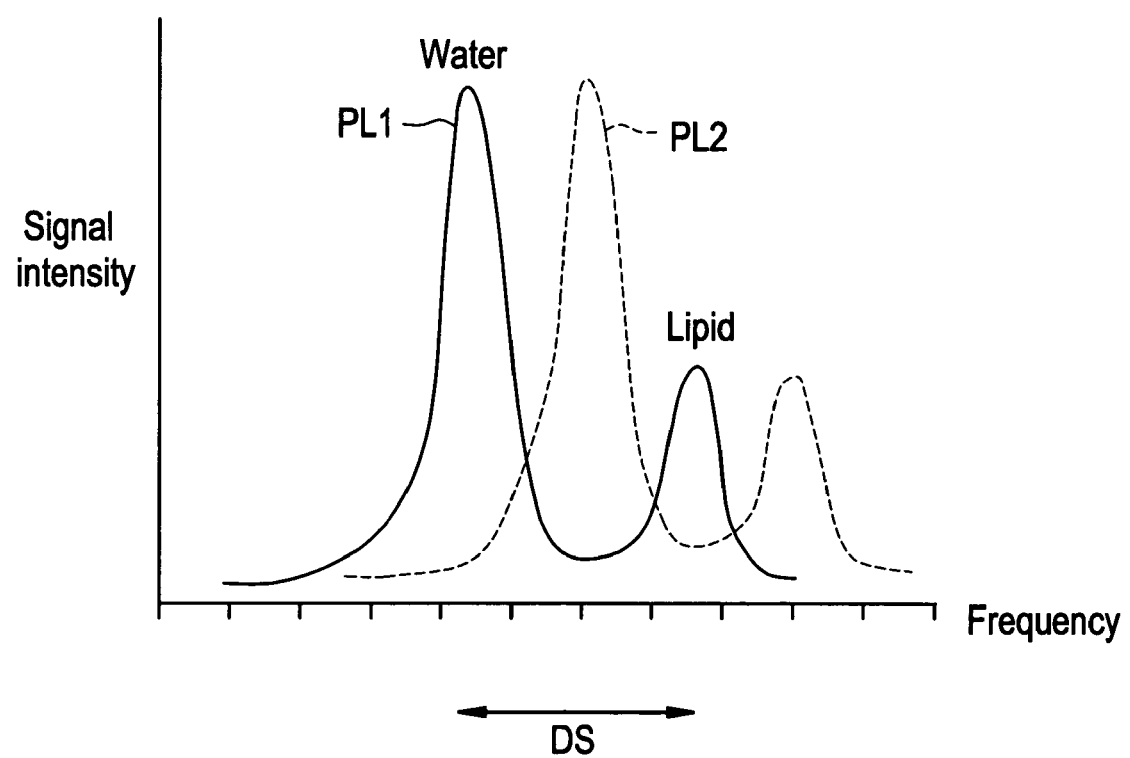
FIG. 7 is a diagram for explaining a spectrum of magnetic resonance signals.

FIG. 7 is a diagram showing spectra of magnetic resonance signals. In FIG. 7, the horizontal axis represents frequency, and the vertical axis represents signal intensity.

The resonance frequency of a magnetic resonance signal is determined by the magnitude of a static magnetic field in which a subject is placed, and the gyromagnetic ratio that depends upon the type of protons in tissue in the subject. For example, plots PL1 and PL2 in FIG. 7 represent spectra of magnetic resonance signals in a frequency band including resonance frequencies of water and lipid (fat); which show two peaks representing the resonance frequency of water protons and that of lipid protons.

To acquire an image effective for diagnosis in magnetic resonance imaging, an image is preferably produced using magnetic resonance signals including no lipid frequency band that is less effective for diagnosis and including only water frequency band. Moreover, there is known an imaging technique such as the CHESS technique, for example, for suppressing a specific frequency band, e.g., the resonance frequency of lipid. The resonance frequency representing specific tissue, e.g., water or lipid, in a slice will be referred to as the central frequency of that slice here.

As can be seen from the aforementioned example, it is very important to accurately know the central frequency in magnetic resonance imaging.

However, the resonance frequency of tissue also varies with the magnitude of a static magnetic field, as mentioned above. Thus, if inhomogeneity occurs in the static magnetic field, the central frequency is differentiated between the same protons in different slices, and there occurs a difference in resonance frequency as indicated by the plot PL1 shifting to the plot PL2 as exemplarily shown in FIG. 7.

The difference in resonance frequency leads to inconveniences in that the frequency of RF waves applied by the RF coil sections 180a and 180b for exciting, for example, water protons and the actual central frequency of water in a slice becomes different and the desired image possibly cannot be obtained. In the magnet system of mid-to-low magnetic field, the peak-to-peak distance DS between the resonance frequencies of protons in the different tissue is smaller, and therefore, it is more important to accurately obtain information on resonance frequency bands of protons.

In the following, a procedure of estimating and obtaining the central frequencies of a plurality of slices at different positions, and conducting magnetic resonance imaging using the obtained central frequencies will be explained in detail.

Figure 2:
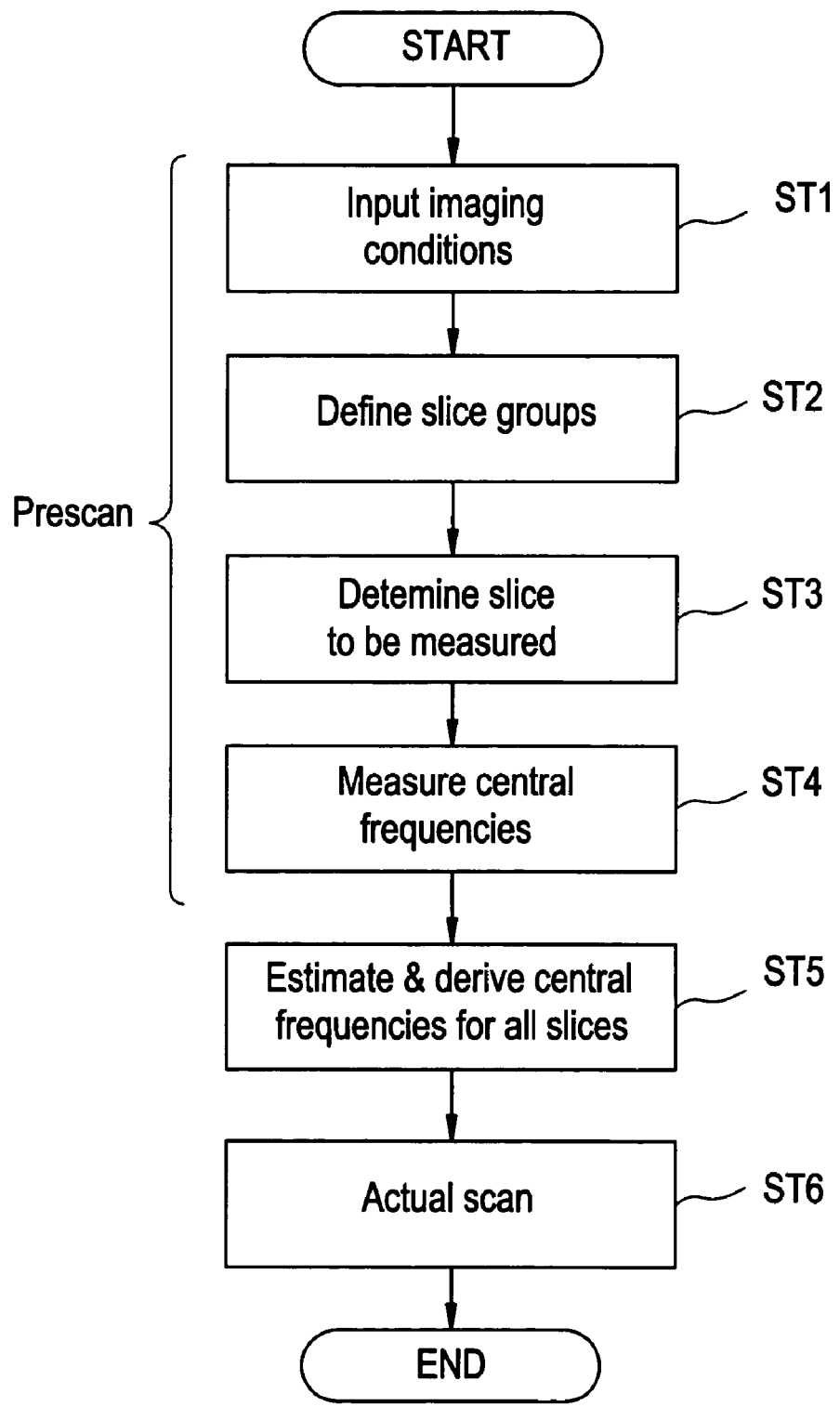
FIG. 2 is a chart showing a procedure of estimating central frequencies of a plurality of slices and conducting magnetic resonance imaging in accordance with an embodiment of the present invention.

FIG. 2 is a chart showing a procedure of estimating central frequencies of a plurality of slices and conducting magnetic resonance imaging in accordance with the present embodiment.

First in imaging, a central frequency is obtained corresponding to a region of the subject. For this, the operator inputs imaging conditions such as a region to be imaged in the subject via the operating section 19 (Step ST1).

The MR apparatus control section 17 sends the input imaging conditions to the magnet system control section 15. The magnet system control section 15 divides the imaged region into slices based on the sent information on the imaged region, and defines a slice group by combining a certain number of slices (Step ST2). This process will be described below in detail.

Figure 3:
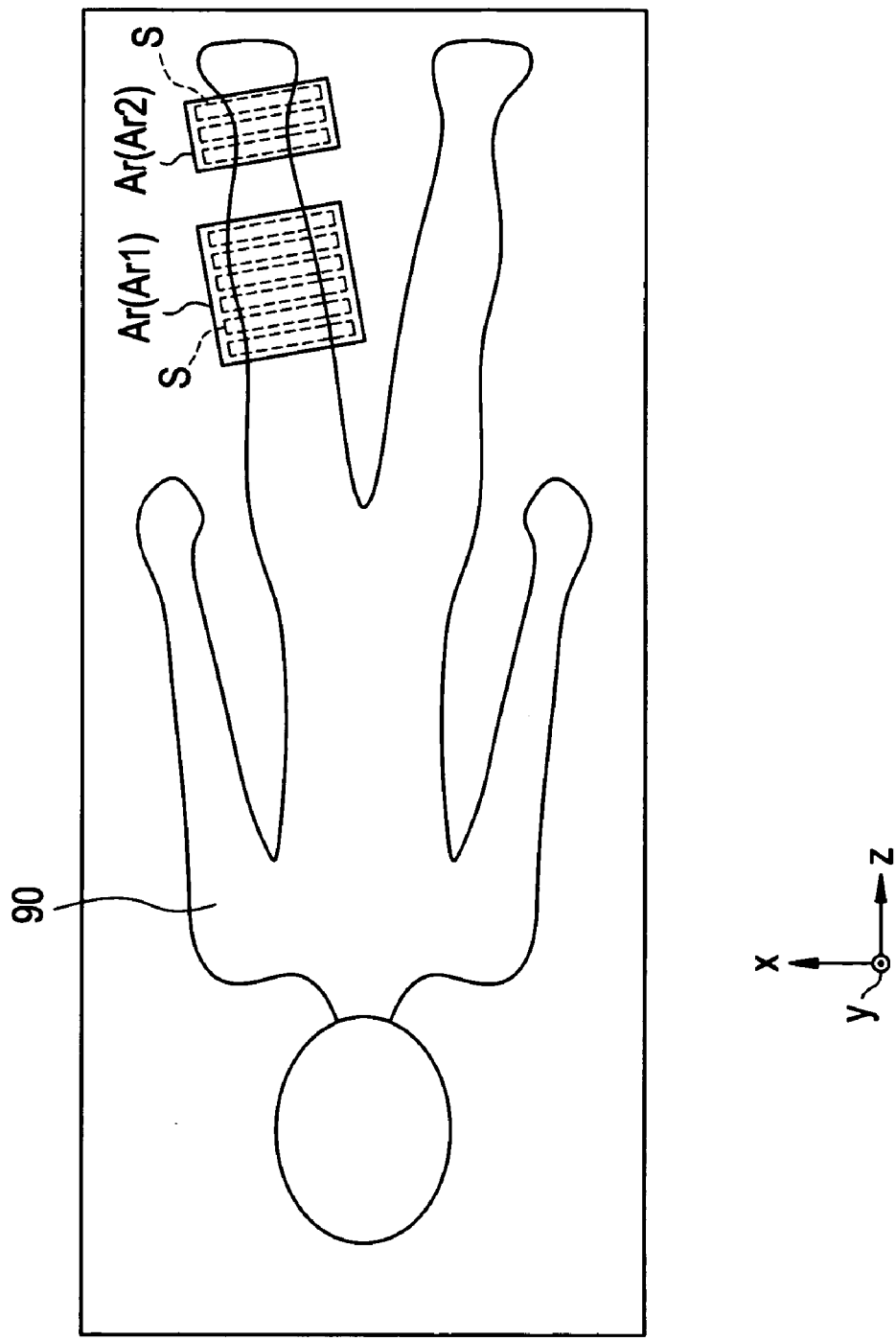
FIG. 3 is a diagram representing the relationship between an imaged region and slices.

FIG. 3 is a diagram representing the relationship between an imaged region and slices. As shown in FIG. 3, a plurality of imaged regions Ar may be specified at arbitrary positions in a subject 90 placed in a static magnetic field, within the hardware capability of the main body section 110. The imaged regions Ar may be spaced apart from one another, and they do not necessarily need to be defined in the same direction. However, the imaged regions Ar are generally defined at positions relatively close to each other, as shown in FIG. 3.

After specifying the imaged regions Ar as shown in FIG. 3, the magnet system control section 15 divides each imaged region Ar into a plurality of slices S of predetermined slice thickness. The total number of the slices S in all the imaged regions Ar is dependent upon hardware capability of the main body section 110.

The direction of arrangement of the plurality of slices S can be arbitrarily determined. The direction may be inclined with respect to any one of x-, y- and z-directions. However, the slices S are preferably defined in parallel with one another and at regular intervals within each imaged region Ar, so that the definition of the imaged regions Ar and slices S can be intuitively recognized and accuracy in estimation of a central frequency for each slice S can be improved. FIG. 3 exemplifies all slices S being orthogonal to the x-z plane.

The direction of arrangement of the slices S may be different between the imaged regions Ar, as long as the slices S are parallel in each imaged region Ar.

Moreover, the interval between the slices S may be different between the imaged regions Ar.

After thus dividing each imaged region Ar into the plurality of slices S, the magnet system control section 15 defines a slice group (referred to simply as a group hereinbelow) by combining a certain number of slices S. For this, the magnet system control section 15 calculates the number of slices S whose central frequencies can be measured within a predetermined time t usable to obtain the central frequencies.

A too long time t leads to problems including that the total imaging time up to the end of imaging is lengthened and the subject suffers a decline in comfort, and therefore, the time t is limited to a few seconds (one or two seconds), for example, and information on the time t is stored in the storage section (not shown).

Since tasks to be done within the usable time t include various ones such as alignment of the subject and specification of an imaging procedure, in addition to the measurement of central frequencies, the number of slices S whose central frequencies can be measured varies with the total number of the slices S.

After the above calculation, the magnet system control section 15 defines a group based on the number of measurable slices S obtained from the calculation. For example, when two imaged regions Ar1 and Ar2 are specified as shown in FIG. 3, and the number of measurable slices S is three, the magnet system control section 15 divides, for example, the imaged regions Ar1 into two groups each having a slice S whose central frequency is to be measured.

In contrast, assume that the number of measurable slices S is one for two imaged regions Ar1 and Ar2, for example. Then, if each of the imaged regions Ar1 and Ar2 is regarded as a group, there inconveniently occurs a group having no slice S to be measured; in such a case, the imaged regions Ar1 and Ar2 spaced apart are regarded as one group.

By thus re-grouping all slices S based on information on the number of measurable slices S derived from the time t usable for measuring central frequencies and on the total number of all the slices S, even if the number of imaged regions Ar and the number of slices S are different for each time of imaging, the magnet system control section 15 can be easily adapted to such a variation to conduct processing.

When the number of imaged regions Ar is smaller than the number of measurable slices S, the magnet system control section 15 selects an imaged region Ar to be divided into a plurality of groups depending upon several conditions including the size of each imaged region Ar, the number of slices S in each imaged region Ar and the like. For example, an imaged region Ar having a greater number of slices S is divided. If the numbers of slices S are the same, a larger imaged region Ar is selected.

By thus grouping the imaged regions Ar based on the number of slices S whose central frequencies are to be measured, one slice S whose central frequency is to be measured is included in every group. Therefore, even for a large imaged region Ar, the slices S whose central frequencies are to be measured are relatively evenly distributed to allow central frequencies to be estimated with higher accuracy.

Figure 4:
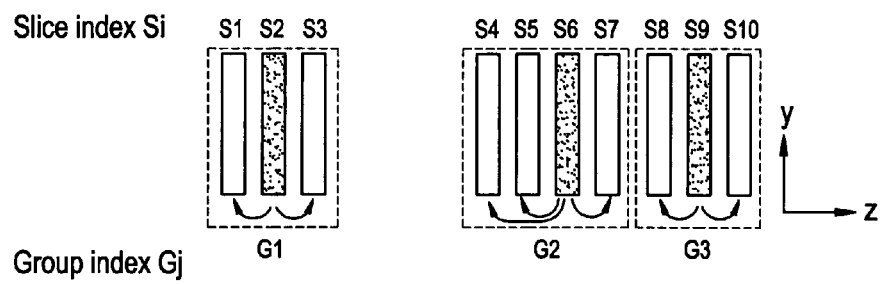
FIG. 4 is a diagram showing an exemplary pattern of defining slice groups in the first embodiment.

The first embodiment addresses a case in which the plurality of slices S are grouped in a pattern as exemplarily shown in FIG. 4. In FIG. 4, a plurality of slices S having a certain thickness in the z-direction are defined in parallel with the x-y plane, i.e., orthogonal to the z-direction, and in parallel with one another. FIG. 4 is an enlarged diagram of the thus-defined plurality of slices S as viewed in the x-direction.

Each slice in the plurality of slices S shown in FIG. 4 is represented by a slice index $S_i$ ($i=1, 2, 3, \ldots$). In the present embodiment, ten slices S1–S10 are defined.

As set forth above, the magnet system control section 15 groups the slices Si according to the number of slices S whose central frequencies can be measured, which number is determined based on the length of the time t, and to the size of the imaged regions Ar specified at Step ST1.

FIG. 4 shows a case in which the number of slices S whose central frequencies can be measured is three, and the magnet system control section 15 defines a slice group (referred to simply as a group hereinbelow) G1 of slices S1–S3, a group G2 of slices S4–S7, and a group G3 of slices S8–S9, for example. The groups of slices will be generically designated as a group index $G_j$ ($j=1, 2, 3, \ldots$) hereinbelow.

The slice groups Gj are thus defined.

Next, the magnet system control section 15 determines a slice whose central frequency is to be measured in each group Gj (Step ST3).

Since at Step ST2, the number of groups has been determined based on the number of slices whose central frequencies can be measured, the magnet system control section 15 allocates one slice S whose central frequency is to be measured to each group.

In the present embodiment, slices S2, S6 and S9 are defined as slices to be measured, so that the central frequency of one slice per group is measured. Thus, the central frequency of a center slice, for example, is measured. If the number of slices in a group is even, one of the middle slices (for example, the one having a larger slice index $S_i$) is defined as the slice to be measured.

It should be noted that the slice to be measured need not necessarily be a center slice.

Moreover, at Steps ST2 and ST3, no gradient magnetic field is applied to actually select the slices, but the magnet system control section 15 generates a driving sequence for controlling the driving section 250 so that the defined slices can be selected.

After determining the slices to be measured, the magnet system control section 15 controls the RF coil driving section 12, gradient coil driving section 13 and data collecting section 14 to measure the central frequencies of the slices to be measured (Step ST4).

When measuring the central frequencies, the magnet system control section 15 drives and controls the driving section 250 according to a driving sequence generated for selecting, for example, a slice S2, and causes the gradient coil sections 160a and 160b to apply a gradient magnetic field for selecting the slice S2. The magnet system control section 15 then causes the RF coil sections 180a and 180b to apply to the slice S2 an RF wave of a frequency band including a frequency band of, for example, resonance frequencies of water and lipid.

Spectral information on magnetic resonance signals from the slice S2 detected by the RF coil sections 180a and 180b upon termination of the application of the RF wave having a certain width of frequency band as described above, is sent to the magnet system control section 15 via the data collecting section 14.

As can be clearly seen from the plots PL1 and PL2 shown in FIG. 7, it is possible to discern a resonance frequency of specific tissue from the shape of a spectrum. The magnet system control section 15 obtains a resonance frequency of desired tissue based on the sent spectral information on magnetic resonance signals. As previously discussed, the resonance frequency of protons in target tissue in a slice is considered as the central frequency in that slice, and therefore, the resonance frequency of water, for example, is the central frequency when the target is water, and the resonance frequency of lipid is the central frequency when the target is lipid.

The central frequency of the slice S2 can thus be measured. The magnet system control section 15 measures slices S6 and S9 for their central frequencies by conducting the same procedure as above.

From the foregoing, it can be said that, speaking generally, a slice to be measured can be selected by driving and controlling the driving section 250 according to a driving sequence generated for selecting the slice to be measured and applying a gradient magnetic field for selecting the slice to be measured. The magnet system control section 15 can then measure the central frequency of the slice to be measured based on magnetic resonance signals acquired under application of an RF wave having a certain width of frequency band by the RF coil sections 180a and 180b.

Steps ST1–ST4 are together referred to here as a prescan step, in that they constitute a preparatory stage for actual imaging for producing a magnetic resonance image, i.e., for an actual scan.

After the prescan, the magnet system control section 15 estimates and derives the central frequencies for slices S1–S10 (Step ST5).

In the present embodiment, the magnet system control section 15 uses the measured central frequency of the slice S2 as is for the central frequencies of the slices S1 and S3. The magnet system control section 15 also uses the central frequency of the slice S6 as the central frequencies of the slices S4, S5 and S7, and the central frequency of the slice S9 as the central frequencies of the slices S8 and S10.

In other words, in the present embodiment, the magnet system control section 15 estimates that the central frequency for one slice to be measured in a slice group is equal to the central frequencies for all other slices in the group that the slice to be measured belongs to.

After the magnet system control section 15 has obtained information on central frequencies of all slices, the MR apparatus control section 17 controls the driving section 250 to execute an actual scan for actually acquiring a magnetic resonance image for each slice in the subject (Step ST6).

In the actual scan, the driving section 250 executes a driving sequence according to a technique such as a gradient echo or spin echo technique after executing, for example, the CHESS technique. Magnetic resonance signals in which the resonance frequency of predetermined tissue (e.g., lipid) is suppressed can thus be obtained to produce a magnetic resonance image with image brightness reduced for a lipid portion.

Detailed description on a procedure for producing a magnetic resonance image in which lipid (fat) is suppressed using the CHESS technique is found in references such as the aforementioned Non-Patent Document 1, and is therefore omitted here.

As described above, according to the first embodiment, a plurality of slices representing an imaged region in a subject are grouped in several groups. Next, one slice whose central frequency is to be measured is selected from each group, and the central frequency of the slice to be measured is measured. The central frequency of the slice to be measured is then used as the central frequency for slices other than the slice to be measured in each group. Since it is not necessary to measure the central frequencies for all slices, time required to obtain information of central frequencies for all slices is significantly reduced compared with a case in which central frequencies for all slices are actually measured. Consequently, the time required for a prescan is reduced. Moreover, since a central frequency for one slice in each group is actually measured, accuracy in estimation of the central frequencies can be ensured at a certain level. A reduced prescan time lowers the likelihood of an inconvenience such as subject's motion, and accordingly, leads to improvement of accuracy in estimation of the central frequencies and contributes to improvement of image quality of a magnetic resonance image produced in an actual scan.

Since the processing of selecting a slice to be measured etc. can be implemented to be automatically determined based on conditions such as a predetermined prescan time t, the central frequency for each slice can be easily obtained.

<<Second Embodiment>>

The central frequencies of slices other than a slice to be measured may be estimated by fitting, rather than by assigning the measured central frequency of the slice to be measured to them as is. Such an example will be described hereinbelow as a second embodiment.

Figure 5:
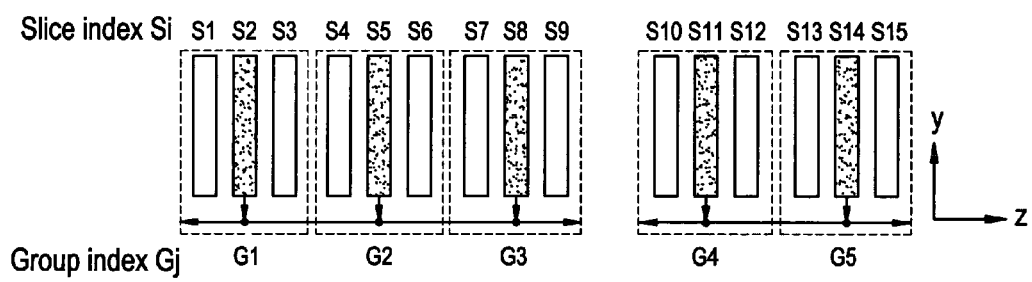
FIG. 5 is a diagram showing an exemplary pattern of defining slice groups in a second embodiment of the present invention.

FIG. 5 is a diagram showing an exemplary pattern of defining slice groups in the second embodiment. FIG. 5 is illustrated with a plurality of slices Si arranged in parallel to one another in the z-direction, as viewed in the x-direction with magnification, as in FIG. 4.

The MR apparatus 100 for use in the second embodiment is generally same as that in the first embodiment. Therefore, detailed description thereof is omitted. Moreover, since the procedure of estimating central frequencies is also generally the same as that shown in FIG. 2, detailed description thereof is omitted.

In the second embodiment, it is assumed that the magnet system 15 has executed the processing of grouping the slices Si as in the first embodiment, and consequently groups have been defined at Step ST2 in FIG. 2 so that each slice group (group) has at least an adjacent group, as shown in FIG. 5.

When the imaged regions Ar are individually divided into slices Si, and the slices Si are grouped based on the number of slices S whose central frequencies can be measured, as described earlier, slices S contained in adjacent groups are arranged in the same direction and at regular intervals between the adjacent groups.

Some groups may be spaced apart, such as the groups G3 and G4 shown in FIG. 5, as long as each group has at least one adjacent group. The arrangement direction and interval of slices S may be different between the spaced-apart groups.

At Step ST3 shown in FIG. 2, and in the second embodiment, one slice to be measured is selected per group so that the slices to be measured in the adjacent groups are at regular intervals: e.g., slices S2, S5 and S8 and slices S11 and S14 are selected.

As in the first embodiment, the slices to be measured only need to be selected at regular intervals and they need not necessarily be central slices of the groups.

The central frequencies of the thus-determined slices to be measured (slice S2, S5, S8, S11 and S14) are actually measured as in the procedure as described regarding Step ST4 shown in FIG. 2.

Thereafter, in the procedure at Step ST5 in FIG. 2, the second embodiment estimates central frequencies for slices other than the measured slices based on the data of the central frequencies obtained by the measurement, using fitting processing such as interpolation, extrapolation, or combined interpolation/extrapolation processing.

For example, linear or quadratic interpolation can be applied as the interpolation processing. The same applies to the extrapolation processing.

For example, the magnet system control section 15 calculates through interpolation central frequencies for the slices S3, S4, S6 and S7 based on the measured data of the central frequencies of the slices S2, S5 and S8. Moreover, it calculates through extrapolation central frequencies for the slices S1 and S9 based on the measured data of the central frequencies of the slices S2, S5 and S8.

The same applies to the groups G4 and G5.

Using the data of the central frequencies obtained by the estimation based on such fitting processing, an actual scan is conducted.

In the second embodiment, the same effects as those in the first embodiment can be obtained. In addition, central frequencies of slices other than a slice to be measured is estimated in the second embodiment by fitting processing based on central frequency data obtained by actual measurement as described above. Thus, even if a static magnetic field varies and is inhomogeneous, information on central frequencies for the slices can be obtained with higher accuracy than that in the first embodiment insofar as the variation of the static magnetic field is smooth.

<<Third Embodiment>>

If the variation of the magnetic field is smooth, central frequencies can be somewhat accurately estimated by the second embodiment; however, the variation of the magnetic field is not always smooth. In the third embodiment, a mode that can accommodate an irregular variation of the magnetic field is addressed.

Figure 6:
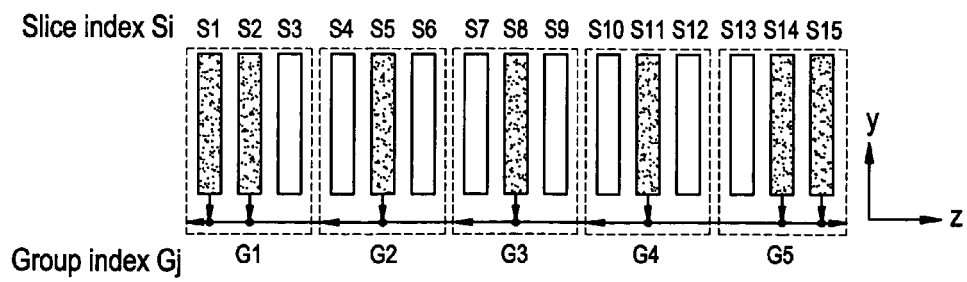
FIG. 6 is a diagram showing an exemplary pattern of defining slice groups in a third embodiment of the present invention.

FIG. 6 is a diagram showing an exemplary pattern of defining slice groups in the third embodiment. FIG. 6 is illustrated with a plurality of slices Si arranged in parallel to one another in the z-direction, as viewed in the x-direction with magnification, as in FIG. 4. FIG. 6 exemplifies a case in which the number of slices S whose central frequencies can be measured is seven, and a unitary imaged region Ar of fifteen slices S is grouped with the largest number of slices S contained in one group being three.

Since the configuration of the MR apparatus 100 and the procedure of estimating central frequencies for use in the third embodiment are generally same as those in the first embodiment, detailed description thereof is omitted.

In the third embodiment, for example, slices S1, S2, S5, S8, S11, S14 and S15 shown in FIG. 6 are defined as slices to be measured.

When, for example, the largest number of slices S contained in each group is thus fixed and some margin is allowed regarding the number of slices to be measured, i.e., slices whose central frequencies are actually measured, the number of slices to be measured need not necessarily be one per group, and can be appropriately determined.

The slices to be measured are determined so that the number of slices to be measured is larger in a region in which the static magnetic field is inhomogeneous, that is, in a region in which the static magnetic field less smoothly varies, than in a region in which the static magnetic field is homogeneous.

The static magnetic field has a tendency to be more inhomogeneous in a peripheral portion than in a central portion in an area over which the static magnetic field is generated. The central frequencies of slices lying in such a peripheral portion are preferably actually measured as the slices to be measured, in that accuracy in estimation of central frequencies is improved.

Homogeneity of a static magnetic field can be known by measuring the magnetic field intensity of the static magnetic field, for example.

Once central frequencies of such slices to be measured have been actually measured and obtained, central frequencies of slices other than the slices to be measured are determined by fitting processing including interpolation/extrapolation processing such as linear or polynomial interpolation as in the second embodiment.

In the third embodiment, the same effects as those in the first and second embodiments can be obtained. In addition, in the third embodiment, the central frequencies are measured more densely in a region in which the static magnetic field is inhomogeneous than in a homogeneous region, and slices to be measured are automatically defined according to homogeneity of the static magnetic field. Thus, when the number of slices to be measured is fixed, accuracy in estimation of central frequencies is significantly improved than in the second embodiment. Especially, since slices lying in the periphery of a static magnetic field generated region at which the static magnetic field is susceptible to inhomogeneity are selected as the slices to be measured, central frequencies can be accurately obtained.

According to the third embodiment, image quality of a magnetic resonance image obtained in an actual scan can be further improved over that in the first or second embodiment even if the static magnetic field has inhomogeneity.

It should be noted that the present invention is not limited to the aforementioned embodiments but may be appropriately modified. For example, the present invention can be applied to a "cylindrical" MR imaging apparatus having a cylindrically formed bore, as well as to the open MR imaging apparatus 100 shown in FIG. 1.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus for selecting a slice of certain thickness in a subject, and generating image data of said slice based on magnetic resonance signals of desired central frequency obtained from said slice, said apparatus comprising:

a slice group defining device for defining a first slice group containing a plurality of slices parallel to one another within an arbitrary imaged region in said subject;

a central frequency measuring device for measuring a first central frequency of a first one of said slices contained in said first slice group; and a central frequency estimating device for estimating the remaining central frequencies of the remaining slices other than the first one of the slices, based on said first central frequency obtained by the measurement by said central frequency measuring device, wherein said central frequency estimating device configured to estimate the remaining central frequencies of the remaining slices by executing a procedure other than applying a plurality of gradient fields to the remaining slices.

2. The magnetic resonance imaging apparatus of claim 1, wherein:

when a plurality of imaged regions are present spaced apart from one another, said slice group defining device defines a larger number of a plurality of slice groups in a wider one of said imaged regions; and said central frequency measuring device measures a central frequency of at least one slice per slice group.

3. The magnetic resonance imaging apparatus of claim 1, wherein:

said central frequency estimating device uses the first central frequency of the first one of the slices in said first slice group obtained by the measurement by said central frequency measuring device as the remaining central frequencies of the remaining slices in said first slice group.

4. The magnetic resonance imaging apparatus of claim 3, wherein:

said slice group defining device defines the positions of a plurality of said slices in one slice group at regular intervals.

5. The magnetic resonance imaging apparatus of claim 1, further comprising:

a control device for controlling said central frequency measuring device and said central frequency estimating device in cooperation; automatically calculating the number of the first one of the slices, based on data of a given usable time and a total number of all said slices; causing said central frequency measuring device to measure the first central frequency for the calculated number of the first one of the slices; and causing said central frequency estimating device to estimate the remaining central frequencies of the remaining slices other than the first one of the slices based on the obtained data of the first central frequency.

6. The magnetic resonance imaging apparatus of claim 1, wherein:

a static magnetic field applied to said subject for acquiring said magnetic resonance signals is a mid-to-low magnetic field having magnetic field intensity of 0.2–0.7 Teslas.

7. A magnetic resonance imaging apparatus for selecting a slice of certain thickness in a subject, and generating image data of said slice based on magnetic resonance signals of desired central frequency obtained from said slice, said apparatus comprising:

a slice group defining device for defining a slice group containing a plurality of said slices parallel to one another within an arbitrary imaged region in said subject;

a central frequency measuring device for measuring a central frequency of any one of said slices contained in said slice group; and a central frequency estimating device for estimating central frequencies of said slices other than that whose central frequency is measured, based on said central frequency obtained by the measurement by said central frequency measuring device, wherein:

said slice group defining device defines a plurality of said slice groups adjacent to one another in which said slices are arranged at regular intervals;

said central frequency measuring device selects one slice for each of said plurality of slice groups at regular intervals, and measures a central frequency of said slice; and said central frequency estimating device estimates central frequencies of other slices by fitting processing based on data of the central frequency of said slice whose central frequency is measured by said central frequency measuring device.

8. The magnetic resonance imaging apparatus of claim 7, wherein:

said central frequency estimating device conducts linear or quadratic interpolation/extrapolation processing as said fitting processing.

9. A magnetic resonance imaging apparatus for selecting a slice of certain thickness in a subject, and generating image data of said slice based on magnetic resonance signals of desired central frequency obtained from said slice, said apparatus comprising:

a slice group defining device for defining a slice group containing a plurality of said slices parallel to one another within an arbitrary imaged region in said subject;

a central frequency measuring device for measuring a central frequency of any one of said slices contained in said slice group; and a central frequency estimating device for estimating central frequencies of said slices other than that whose central frequency is measured, based on said central frequency obtained by the measurement by said central frequency measuring device, wherein:

said central frequency measuring device selects said slices in said slice group more densely in a region in which a static magnetic field applied to said subject for acquiring said magnetic resonance signals is relatively inhomogeneous than in a region in which said static magnetic field is relatively homogeneous, and measures their central frequencies; and said central frequency estimating device estimates central frequencies of other slices by fitting processing based on data of the central frequency of said slice whose central frequency is measured by said central frequency measuring device.

10. The magnetic resonance imaging apparatus of claim 9, wherein:

said central frequency measuring device measures a central frequency of said slice lying near the periphery of a region over which said static magnetic field is generated.

11. A central frequency estimating method for use in a magnetic resonance imaging apparatus for selecting a slice of certain thickness in a subject, and generating image data of said slice based on magnetic resonance signals of desired central frequency obtained from said slice, said method comprising:

a first slice group defining step of defining a first slice group containing a plurality of said slices parallel to one another within an arbitrary imaged region in said subject;

a central frequency measuring step of measuring a first central frequency of a first one of said slices contained in said first slice group; and a central frequency estimating step of estimating the remaining central frequencies of the remaining slices other than the first one of the slices, based on said first central frequency obtained at said central frequency measuring step, wherein said estimating the remaining central frequencies is performed by executing a procedure other than applying a plurality of gradient fields to the remaining slices.

12. The central frequency estimating method of claim 11, wherein:

when a plurality of imaged regions are present spaced apart from one another, said first slice group defining step comprises defining a plurality of slice groups in a wider one of said imaged regions; and said central frequency measuring step comprises measuring a central frequency of at least one slice per slice group.

13. The central frequency estimating method of claim 11, wherein:

said central frequency estimating step comprises using the first central frequency of the first one of the slices in said first slice group obtained at said central frequency measuring step as the remaining central frequencies of the remaining slices in said first slice group.

14. The central frequency estimating method of claim 13, wherein:

said slice group defining step comprises defining the positions of a plurality of said slices in one slice group at regular intervals.

15. The central frequency estimating method of claim 11, further comprising:

before said first slice group defining step, a condition specifying step of specifying conditions on a usable time and a total number of all said slices; and a measured slice selecting step of selecting the first one of the slices, based on the data of said time and said number of slices; wherein:

said central frequency measuring step comprises measuring the first central frequency of said first one of the slices selected at said measured slice selecting step; and said central frequency estimating step comprises estimating central frequencies of the remaining slices other than the first one of the slices based on data of the first central frequency obtained at said central frequency measuring step.

16. The central frequency estimating method of claim 11, wherein:

a static magnetic field applied to said subject for acquiring said magnetic resonance signals is a mid-to-low magnetic field having magnetic field intensity of 0.2–0.7 Teslas.

17. A central frequency estimating method for use in a magnetic resonance imaging apparatus for selecting a slice of certain thickness in a subject, and generating image data of said slice based on magnetic resonance signals of desired central frequency obtained from said slice, said method comprising:

a slice group defining step of defining a slice group containing a plurality of said slices parallel to one another within an arbitrary imaged region in said subject;

a central frequency measuring step of measuring a central frequency of any one of said slices contained in said slice group; and a central frequency estimating step of estimating central frequencies of said slices other than that whose central frequency is measured, based on said central frequency obtained at said central frequency measuring step, wherein:

said slice group defining step comprises defining a plurality of said slice groups adjacent to one another in which said slices are arranged at regular intervals;

said central frequency measuring step comprises selecting one slice for each of said plurality of slice groups at regular intervals, and measures a central frequency of said slice; and said central frequency estimating step comprises estimating central frequencies of other slices by fitting processing based on data of the central frequency of said slice whose central frequency is measured at said central frequency measuring step.

18. The central frequency estimating method of claim 17, comprising:

conducting linear or quadratic interpolation/extrapolation processing as said fitting processing.

19. A central frequency estimating method for use in a magnetic resonance imaging apparatus for selecting a slice of certain thickness in a subject, and generating image data of said slice based on magnetic resonance signals of desired central frequency obtained from said slice, said method comprising:

a slice group defining step of defining a slice group containing a plurality of said slices parallel to one another within an arbitrary imaged region in said subject;

a central frequency measuring step of measuring a central frequency of any one of said slices contained in said slice group; and a central frequency estimating step of estimating central frequencies of said slices other than that whose central frequency is measured, based on said central frequency obtained at said central frequency measuring step, wherein:

said central frequency measuring step comprises selecting said slices in said slice group more densely in a region in which a static magnetic field applied to said subject for acquiring said magnetic resonance signals is relatively inhomogeneous than in a region in which said static magnetic field is relatively homogeneous, and measures their central frequencies; and said central frequency estimating step comprises estimating central frequencies of other slices by fitting processing based on data of the central frequency of said slice whose central frequency is measured at said central frequency measuring step.

20. The central frequency estimating method of claim 19, wherein:

said central frequency measuring step comprises measuring a central frequency of said slice lying near the periphery of a region over which said static magnetic field is generated.

\* \* \* \* \*